United States Patent
Onishi

(10) Patent No.: US 10,833,641 B2
(45) Date of Patent: Nov. 10, 2020

(54) METHODS AND APPARATUS FOR AN AMPLIFIER CIRCUIT

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 52 days.

(21) Appl. No.: 16/234,729

(22) Filed: Dec. 28, 2018

(65) Prior Publication Data

US 2020/0212858 A1  Jul. 2, 2020

(51) Int. Cl.
| | |
|---|---|
| *H03F 1/02* | (2006.01) |
| *H03F 3/45* | (2006.01) |
| *H03F 1/26* | (2006.01) |
| *H03K 3/027* | (2006.01) |

(52) U.S. Cl.
CPC .......... *H03F 3/45269* (2013.01); *H03F 1/26* (2013.01); *H03F 2200/267* (2013.01); *H03F 2200/375* (2013.01); *H03F 2203/45214* (2013.01); *H03K 3/027* (2013.01)

(58) Field of Classification Search
CPC ................ H03F 1/02; H03F 3/45; H03F 3/005
USPC ...................... 330/9, 255; 327/124
See application file for complete search history.

(56) References Cited

U.S. PATENT DOCUMENTS

| 7,504,882 B2 * | 3/2009 | Saito ............... G11C 7/067 330/253 |
| 8,330,537 B1 * | 12/2012 | Ghorpade ............ H03F 1/0277 330/9 |
| 2017/0207761 A1 | 7/2017 | Raman |
| 2018/0123524 A1 | 5/2018 | Polesel |

* cited by examiner

*Primary Examiner* — Steven J Mottola
(74) *Attorney, Agent, or Firm* — The Noblitt Group, PLLC; Hettie L. Haines

(57) ABSTRACT

Various embodiments of the present technology may comprise methods and apparatus for an amplifier circuit. Methods and apparatus for an amplifier circuit according to various aspects of the present invention may comprise a first cross-connect circuit configured to receive an input signal at an input terminal and transmit the input signal to an input stage circuit. The amplifier circuit may further comprise a second cross-connect circuit connected between the input stage circuit and an output stage circuit, and a voltage adjustment circuit connected to the input stage circuit. Each cross-connect circuit may comprise a plurality of switches.

20 Claims, 17 Drawing Sheets

METHODS AND APPARATUS FOR AN AMPLIFIER CIRCUIT

BACKGROUND OF THE TECHNOLOGY

Many electrical systems utilize an amplifier to amplify low-voltage input signals. In order to amplify low-voltage input signals, a high-gain amplifier is generally required. Amplifiers, however, introduce an offset voltage in the amplifier's output signal, such that when the input signal is amplified, the offset voltage is also amplified, which shifts the original operating point of the input signal. In general, the higher the gain, the higher the offset (for example, as illustrated in FIGS. 9-11). In addition, characteristics of the output signal, such as the signal-to-noise ratio, dynamic range, and total harmonic distortion, deteriorate due to the offset voltage. In addition, due to process miniaturization (e.g., 130 nm to 55 nm), the noise characteristics and the current-voltage characteristics of the transistors that are used to form the amplifier deteriorate as the transistors are made smaller and smaller.

SUMMARY OF THE INVENTION

Various embodiments of the present technology may comprise methods and apparatus for an amplifier circuit. Methods and apparatus for an amplifier circuit according to various aspects of the present invention may comprise a first cross-connect circuit configured to receive an input signal at an input terminal and transmit the input signal to an input stage circuit. The amplifier circuit may further comprise a second cross-connect circuit connected between the input stage circuit and an output stage circuit, and a voltage adjustment circuit connected to the input stage circuit. Each cross-connect circuit may comprise a plurality of switches.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various filters, amplifiers, signal converters, signal processors, and semiconductor devices, such as transistors, capacitors, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology. Further, the present technology may employ any number of conventional techniques for pulse generation, clock signal generation, voltage regulation, and the like.

Methods and apparatus for an amplifier circuit according to various aspects of the present technology may operate in conjunction with any suitable electronic system, such as an audio system, a microphone system, a video telephone, an acoustics system, hearing devices, and the like.

Figure 1:
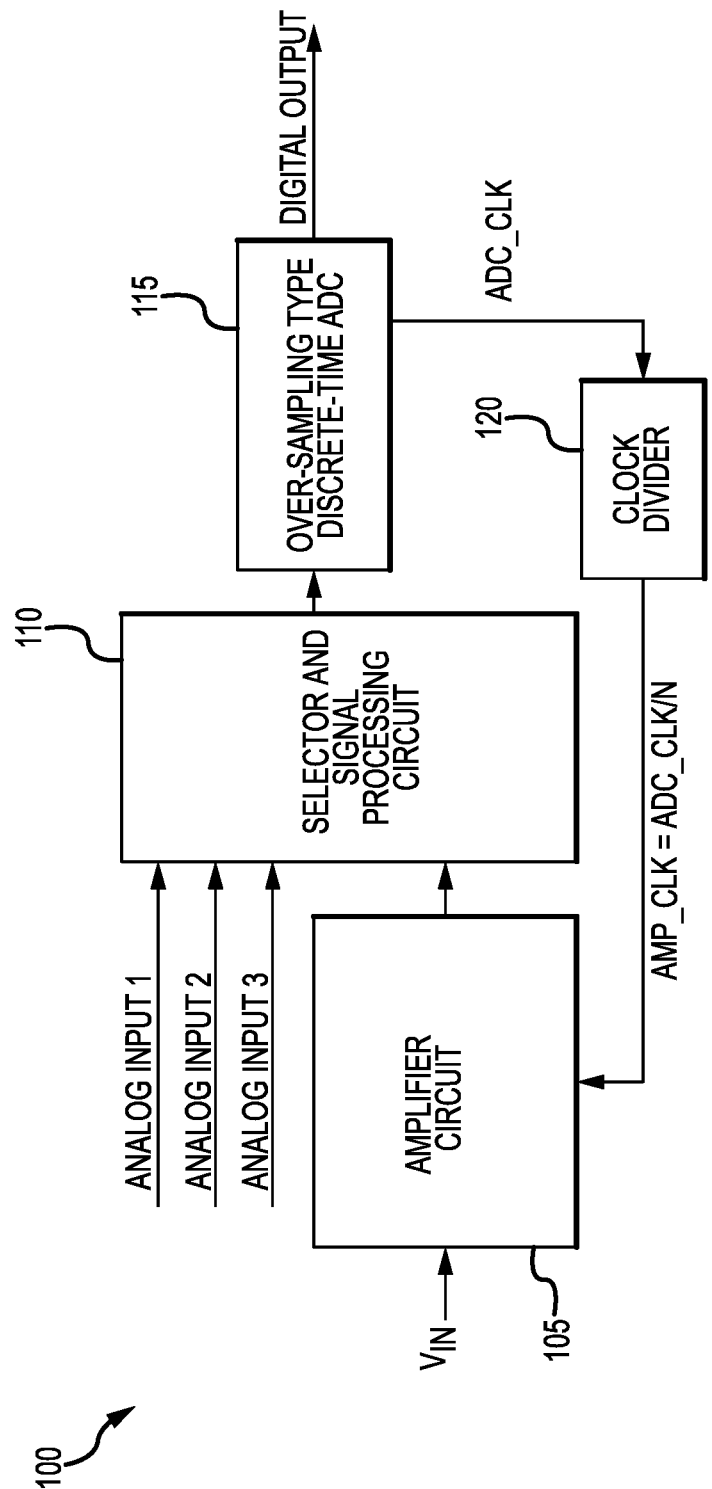
FIG. 1 is a block diagram of a system in accordance with an exemplary embodiment of the present technology.

Referring to FIG. 1, according to various aspects of the present technology, a system 100 may operate in conjunction with or be implemented in an audio system. According to an exemplary embodiment, the system 100 may comprise an amplifier circuit 105 comprising an operational amplifier (op-amp) 302 (FIG. 3) connected to various resistive elements (not shown) and may be configured as a non-inverting amplifier circuit or an inverting amplifier circuit. The system 100 may further comprise a signal processing circuit 110, and an analog-to-digital converter (ADC) 115. According to various embodiments, the system 100 may receive one or more analog input signals, such as radio signals and/or signal sources from other analog devices, an input signal $V_{IN}$, and generate a corresponding digital output signal.

In general, the system 100 may be described according to various characteristics, such a signal-to-noise ratio (SNR), dynamic range DR, and a total harmonic distortion (THD). The SNR may be described as follows:

$$SNR[\text{dB}] = 20 \times \log\left(\frac{\text{signal}}{\text{noise}}\right). \quad \text{(Equation 1)}$$

The dynamic range DR may be described as follows:

$$DR[\text{dB}] = |THD+N| + 60 \quad \text{(Equation 2)},$$

where THD+N is the total harmonic distortion with noise at −60 dBFS input signal. The THD with noise may be described as follows:

$$THD + N[\text{dB}] = \quad \text{(Equation 3)}$$
$$20 \times \log\left(\frac{\sqrt{HD_2^2 + HD_3^2 + HD_4^2 + \ldots + HD_n^2 + noise^2}}{\text{signal}}\right),$$

where HD is a harmonic distortion component.

The signal processing circuit 110 may process the one or more input analog signals and/or a signal from the amplifier circuit 105. For example, the signal processing circuit 110 may comprise a signal selector (not shown) to select one of various analog input signals. The signal processing circuit 110 may be configured to perform various processing functions, such as a gain adjustment and/or conversion from a single-ended signal to a differential signal.

The ADC 115 is configured to convert an analog input signal into a digital signal (i.e., a digital output). According to an exemplary embodiment, the ADC 115 is configured as an over-sampling type, discrete time ADC. For example, the ADC 115 may comprise an input analog circuit component, such as a delta sigma modulator (not shown), connected to output digital circuit component, such as a decimation filter (not shown) and high pass filter (not shown). The ADC 115 may operate according to an ADC clock signal ADC_CLK.

The decimation filter and the high pass filter may operate together to perform noise shaping and sampling functions. In addition, the decimation filter may be configured to remove a clock signal component, such as the clock signals CLK1:CLK4, from the analog input signal.

Figure 2:
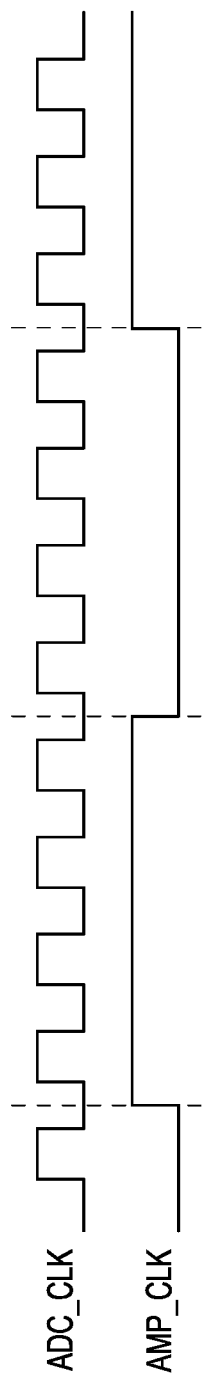
FIG. 2 is a clock signal of an analog-to-digital converter and a clock signal of an amplifier in accordance with an exemplary embodiment of the present technology.

According to an exemplary embodiment, and referring to FIGS. 1 and 2, the system 100 may further comprise a clock divider 120 configured to generate an amplifier clock signal AMP_CLK. For example, the clock divider 120 may divide the ADC clock signal ADC_CLK by a value N, where N is a natural number and is selected according to desired operating conditions and/or a sampling frequency fs of the system 100. In other words, the amplifier clock signal AMP_CLK is proportional to the ADC clock signal ADC_CLK by a factor of 1/N. According to an exemplary embodiment, the amplifier clock signal AMP_CLK has a frequency that is higher than the sampling frequency fs of the system 100 and lower than an operating frequency of the ADC 115. Therefore, the value N may be selected to achieve these conditions. For example, if the sampling frequency fs is 48 kHz, then the ADC operating frequency may be 6.144 MHz (which is 128 times the sampling frequency fs), and the amplifier clock signal AMP_CLK may be 192 kHz (which is 4 times the sampling frequency). Furthermore, the frequency of the amplifier clock signal AMP_CLK is set to a notch frequency of the decimation filter. Also, the decimation filter is able to efficiently remove the amplifier clock component (AMP_CLK) from an output signal $V_{OUT}$ of the amplifier circuit 105.

According to an exemplary embodiment, a rising edge of the amplifier clock signal AMP_CLK is not aligned with a rising edge or a falling edge of the ADC clock signal ADC_CLK. The clock divider 120 may then transmit the amplifier clock signal AMP_CLK to a clock generator 325 and/or the amplifier circuit 105.

Figure 3:
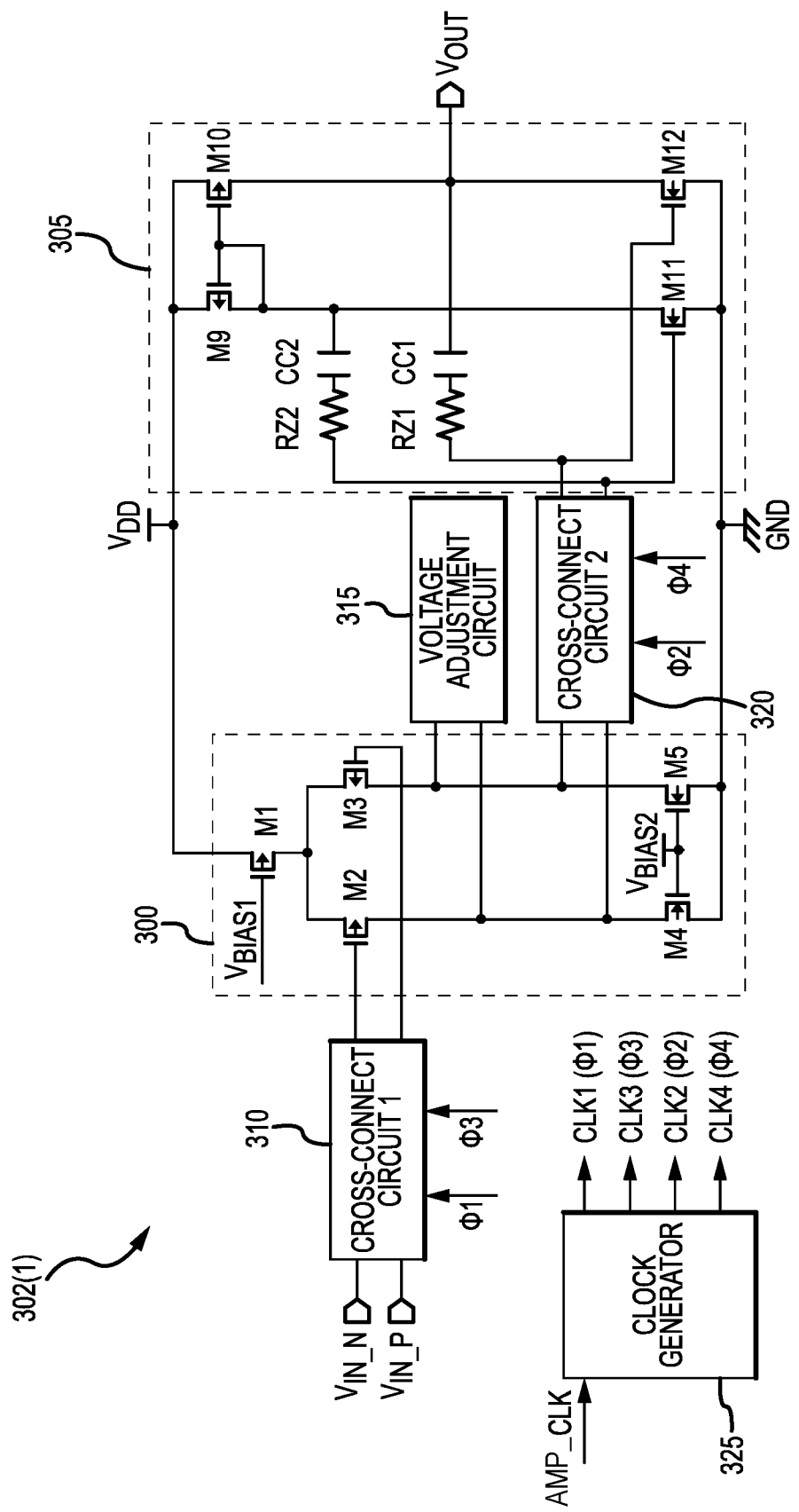
FIG. 3 is a circuit diagram of an operational amplifier in accordance with various embodiments of the present technology.
Figure 4:
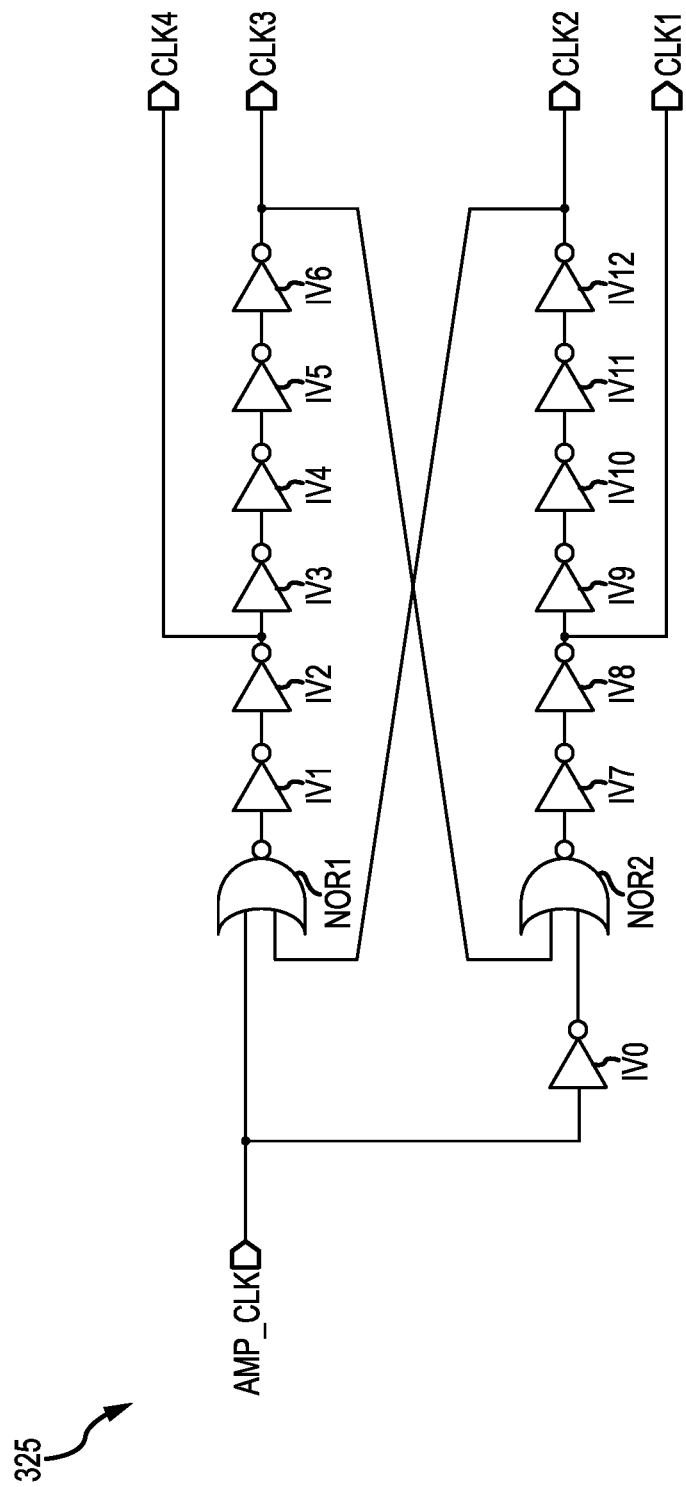
FIG. 4 is a circuit diagram of a clock generator in accordance with the present technology.
Figure 6:
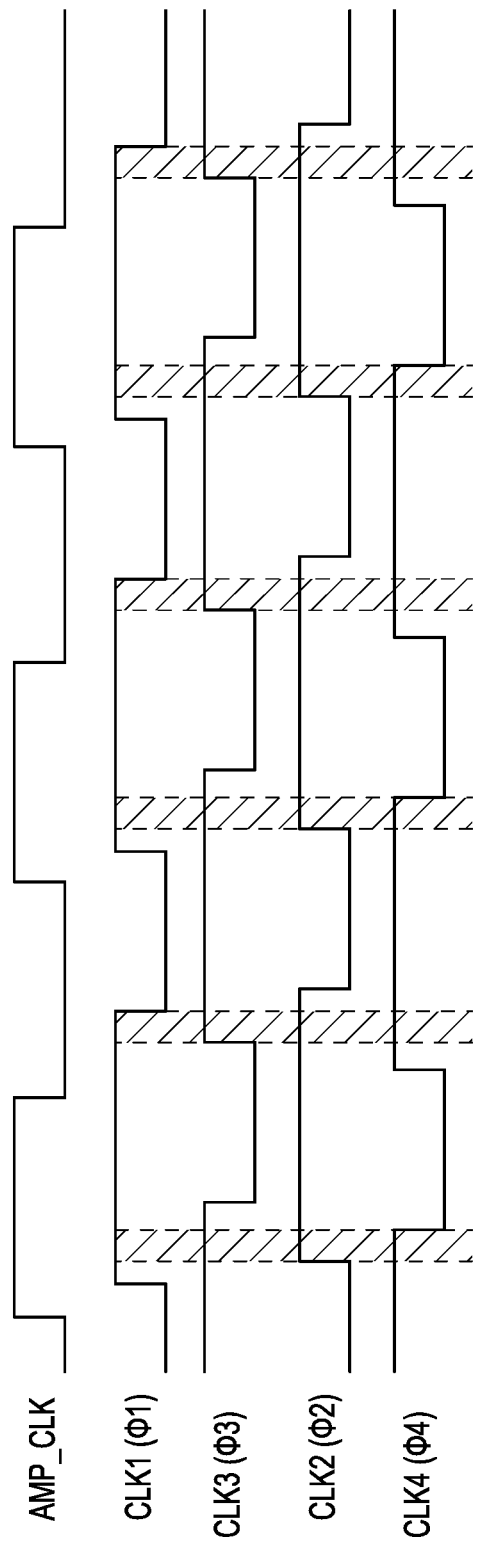
FIG. 6 is a timing diagram of an operational amplifier in accordance with the first embodiment the present technology.

According to an exemplary embodiment, and referring to FIGS. 3, 4 and 6, the op-amp 302 may be configured to operate according to a plurality of clock signals. For example, the system 100 may comprise the clock generator 325 configured to generate a first clock signal CLK1, a second clock signal CLK2, a third clock signal CLK3, and a fourth clock signal CLK4. According to an exemplary embodiment, each clock signal is associated with a corresponding phase, wherein each phase is offset from the other phases, and all the clock signals CLK1:CLK4 have the same frequency. In other words, a rising edge for each clock signal occur at different times. For example, the first clock signal CLK1 may have a first phase ϕ1, the second clock signal CLK2 may have a second phase ϕ2, the third clock signal CLK3 may have third phase ϕ3, and the fourth clock signal CLK4 may have a fourth phase ϕ4.

The clock generator 325 may comprise any circuit and/or system suitable for generating a plurality of clock signals, each with a different phase, according to a reference clock signal, such as the amplifier clock signal AMP_CLK. For example, the clock generator 325 may comprise a plurality of inverters IV0:IV12 and a first NOR gate NOR1 and a second NOR gate NOR2 arranged as illustrated in FIG. 4.

Figure 5:
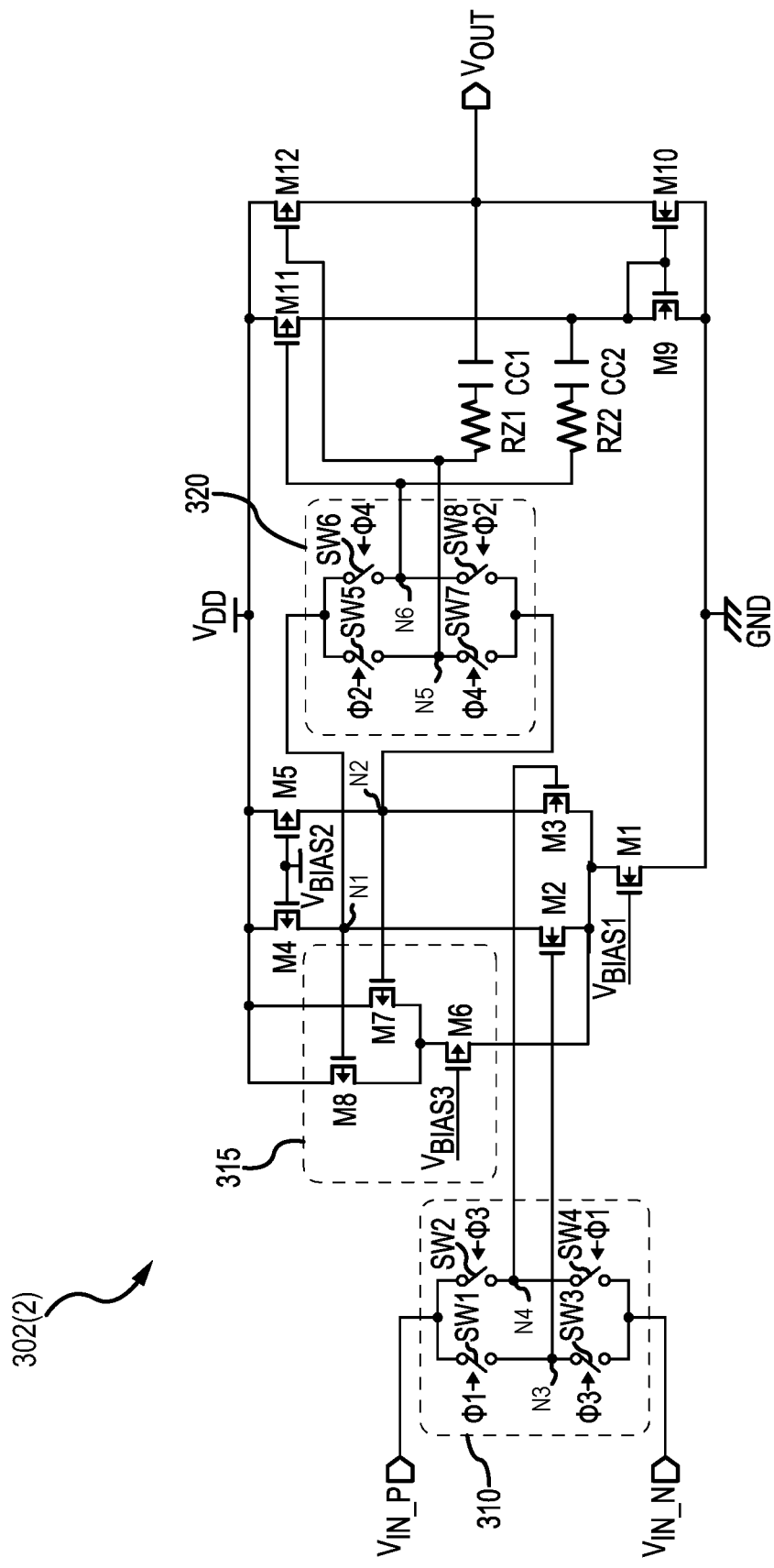
FIG. 5 is a circuit diagram of an operational amplifier in accordance with a first embodiment of the present technology.
Figure 7:
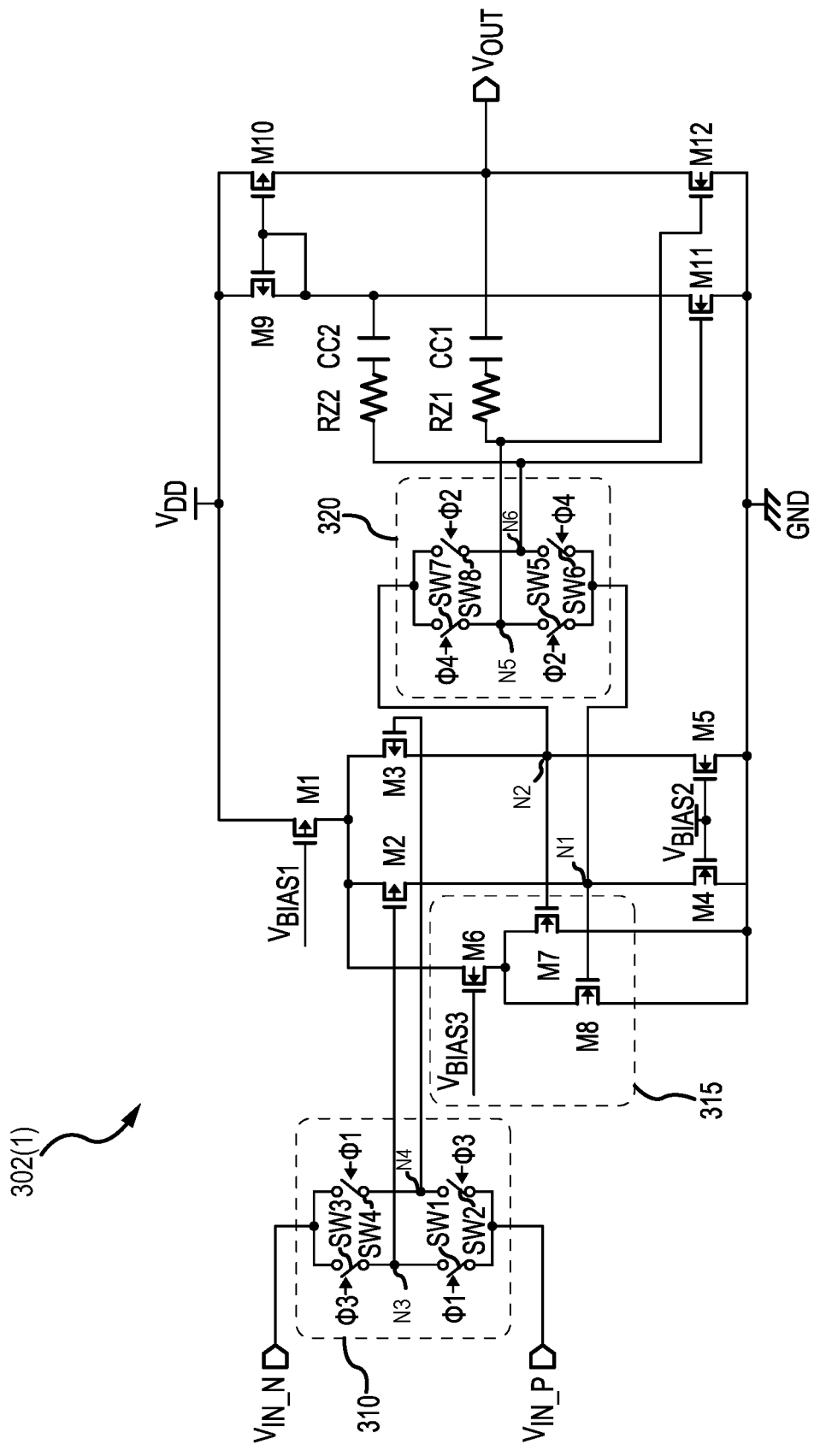
FIG. 7 is a circuit diagram of an operational amplifier in accordance with a second embodiment the present technology.

According to various embodiments, and referring to FIGS. 3, 5, and 7, the op-amp 302 receives the input voltage $V_{IN}$ and amplifies the input voltage $V_{IN}$ to generate the output signal $V_{OUT}$ (i.e., an output voltage). The op-amp 302 may comprise an inverting terminal (not shown) and a non-inverting terminal (not shown) to receive a first input signal $V_{IN\_P}$ (i.e., a first voltage) and a second input signal $V_{IN\_N}$ (i.e., a second voltage), and an output terminal to transmit the output signal $V_{OUT}$ to the signal processing circuit 110. The op-amp 302 may be formed as an integrated circuit and configured as a single-ended op-amp.

The op-amp 302 may comprise various circuits that operate together to remove or reduce an offset voltage of the output signal $V_{OUT}$ and remove or reduce noise in the output signal $V_{OUT}$. The op-amp 302 may comprise circuitry configured to modulate and demodulate the input signals. For example, the op-amp 302 may comprise a first cross-connect circuit 310, a second cross-connect circuit 320, and a voltage adjustment circuit 315. According to an exemplary embodiment, the op-amp 302 may be further configured to perform multiple gain stages. For example, the op-amp 302 may comprise an input stage circuit 300 to perform a first gain stage and an output stage circuit 305 to perform a second gain stage.

The first cross-connect circuit 310 is configured to modulate the first and second input signals $V_{IN\_N}$, $V_{IN\_P}$ by selectively transmitting the first and second input signals $V_{IN\_N}$, $V_{IN\_P}$ to the input stage circuit 300. In addition, the first cross-connect circuit 310 is located in a position that best minimizes a voltage difference of the input signals $V_{IN\_N}$, $V_{IN\_P}$. This configuration doesn't form a DC current path, therefore, a current of the input stage circuit 300 is stable. For example, the first cross-connect circuit 310 may comprise a plurality of switches, such as a first switch SW1, a second switch SW2, a third switch SW3, and a fourth switch SW4. The first and second switches SW1, SW2 may be directly connected to the second input signal $V_{IN\_P}$ and the third and fourth switches SW3, SW4 may be directly connected to the first input signal $V_{IN\_N}$. Each switch SW1:SW4 may be implemented as a transistor. For example, and referring to FIG. 7, each switch SW1:SW4 may be implemented as an n-channel transistor (NMOS) when second and third transistors M2, M3 comprise p-channel transistors (PMOS). Referring to FIG. 5, each switch SW1:SW4 may be implemented as a p-channel transistor when the second and third transistors M2, M3 comprises n-channel transistors.

The first and third switches SW1, SW3 may be connected in series with each other, and the second and fourth switches SW2, SW4 may be connected in series with each other. Each series-connected circuit may be connected in parallel with each other. Each switch SW1:SW4 may be in communication with the clock generator 325 and configured to operate according to a particular clock signal. According to an exemplary embodiment, the first and fourth switches SW1, SW4 may receive and respond to the first clock signal CLK1 and operate according to the first phase $\phi 1$, and the second and third switches SW2, SW3 may receive and respond to the third clock signal CLK3 and operate according to the third phase $\phi 3$.

The input stage circuit 300 is configured to perform a first gain stage and apply a first gain to the first and second input signals $V_{IN\_N}$, $V_{IN\_P}$. For example, the input stage circuit 300 may comprise a plurality of transistors, such as a first transistor M1, a second transistor M2, a third transistor M3, a fourth transistor M4, and a fifth transistor M5. The first transistor M1 may be configured to provide a current. For example, the first transistor M1 may receive a first bias voltage $V_{BIAS1}$ at a gate terminal and a reference voltage, such as a supply voltage $V_{DD}$ or a ground GND, at a source/drain terminal.

The second and third transistors M2, M3 may be connected to the first transistor M1 and configured to form a differential pair. The fourth transistor M4 may be connected to the second transistor M2 at a first node N1 and the fifth transistor M5 may be connected to the third transistor M3 at a second node N2. The fourth and fifth transistors M4, M5 may be connected to each other via gate terminals of each. The fourth and fifth transistors M4, M5 may also receive a second bias voltage $V_{BIAS2}$ at the respective gate terminals.

The input stage circuit 300 may be connected to the first cross-connect circuit 310 and receive the first and second input signals $V_{IN\_N}$, $V_{IN\_P}$ according to the first cross-connect circuit 310. For example, the second transistor M2 may be connected to a third node N3 located between the first and third switches SW1, SW3 via a gate terminal of the second transistor M2. The third transistor M3 may be connected to a fourth node N4 located between the second and fourth switches SW2, SW4 via a gate terminal of the third transistor M3.

The second cross-connect circuit 320 is configured to selectively transmit signals from the input stage circuit 300 to the output stage circuit 305. In addition, the second cross-connect circuit 320 is located in a position that best minimizes a voltage difference of the first and second nodes N1, N2. This configuration doesn't form a DC current path, therefore, a current of the input stage circuit 300 and the output stage circuit 305 is stable. For example, the second cross-connect circuit 320 may comprise a plurality of switches, such as a fifth switch SW5, a sixth switch SW6, a seventh switch SW7, and eighth switch SW8. The fifth and sixth and second switches SW5, SW6 may be connected to the first node N1 and the seventh and eight switches SW7, SW8 may be connected to the second node N2. Each switch SW5:SW8 may be implemented as a transistor. For example, and referring to FIG. 7, each switch SW5:SW8 may be implemented as an n-channel transistor (NMOS) when second and third transistors M2, M3 comprise p-channel transistors (PMOS). Referring to FIG. 5, each switch SW5:SW8 may be implemented as a p-channel transistor when the second and third transistors M2, M3 comprises n-channel transistors.

In addition, the fifth and seventh switches SW5, SW7 may be connected in series with each other at a fifth node N5, and the sixth and eighth switches SW6, SW8 may be connected in series with each other at a sixth node N6. Each series-connected circuit may be connected in parallel with each other. Each switch SW5:SW8 may be in communication with the clock generator 325 and configured to operate according to a particular clock signal. According to an exemplary embodiment, the fifth and eight switches SW5, SW8 may receive and respond to the second clock signal CLK2 and operate according to the second phase $\phi 2$, and the sixth and seventh switches SW6, SW7 may receive and respond to the fourth clock signal CLK4 and operate according to the fourth phase $\phi 4$.

The voltage adjustment circuit 315 may be configured to regulate and/or adjust a voltage of the input stage circuit 300. For example, the voltage adjustment circuit 315 may ensure that a drain voltage level for the fourth and fifth transistors M4, M5 are equal. Furthermore, the voltage adjustment circuit 315 may not comprise any switching devices, which provides a stable current to the input stage circuit 300.

According to an exemplary embodiment, the voltage adjustment circuit 315 may comprise a plurality of transistors, such as a sixth transistor M6, a seventh transistor M7, and an eighth transistor M8. The sixth transistor M6 may be configured to provide a current. For example, the sixth transistor M6 may receive a third bias voltage $V_{BIAS3}$ at a gate terminal and be connected to the first transistor M1 at a source/drain terminal. In addition, the sixth transistor M6 may be directly connected to the first transistor M1 and therefore, the voltage adjustment circuit 315 shares a current source (e.g., the first transistor M1) with the input stage circuit 300. According to an exemplary embodiment, the first, second, and third bias voltages $V_{BIAS1}$, $V_{BIAS2}$, $V_{BIAS3}$ are all different voltage values.

The seventh and eighth transistors M7, M8 may be connected to a source/drain terminal of the sixth transistor M6 via source/drain terminals of the seventh and eighth transistors M7, M8. A gate terminal of the seventh transistor M7 may be connected to the second node N2 and a gate terminal of the eighth transistor M8 may be connected to the first node N1.

The output stage circuit 305 is configured to perform a second gain stage and apply a second gain to the first and second input signal $V_{IN\_N}$, $V_{IN\_P}$ and generate the output signal $V_{OUT}$. For example, the output stage circuit 305 may comprise a plurality of transistors, such as a ninth transistor M9, a tenth transistor M10, an eleventh transistor M11, a twelfth transistor M12. The output stage circuit 305 may further comprise resistive elements, such a resistors RZ1 and RZ2 and capacitive elements, such as capacitors CC1 and CC2.

The output stage circuit 305 may receive signals from the second cross-connect circuit 320. For example, the output stage circuit 305 may be connected the fifth node N5 (located between the fifth and seventh switches SW5, SW7) and the sixth node N6 (located between the sixth and eighth switches SW6, SW8) of the second cross-connect circuit 320.

Figure 16:
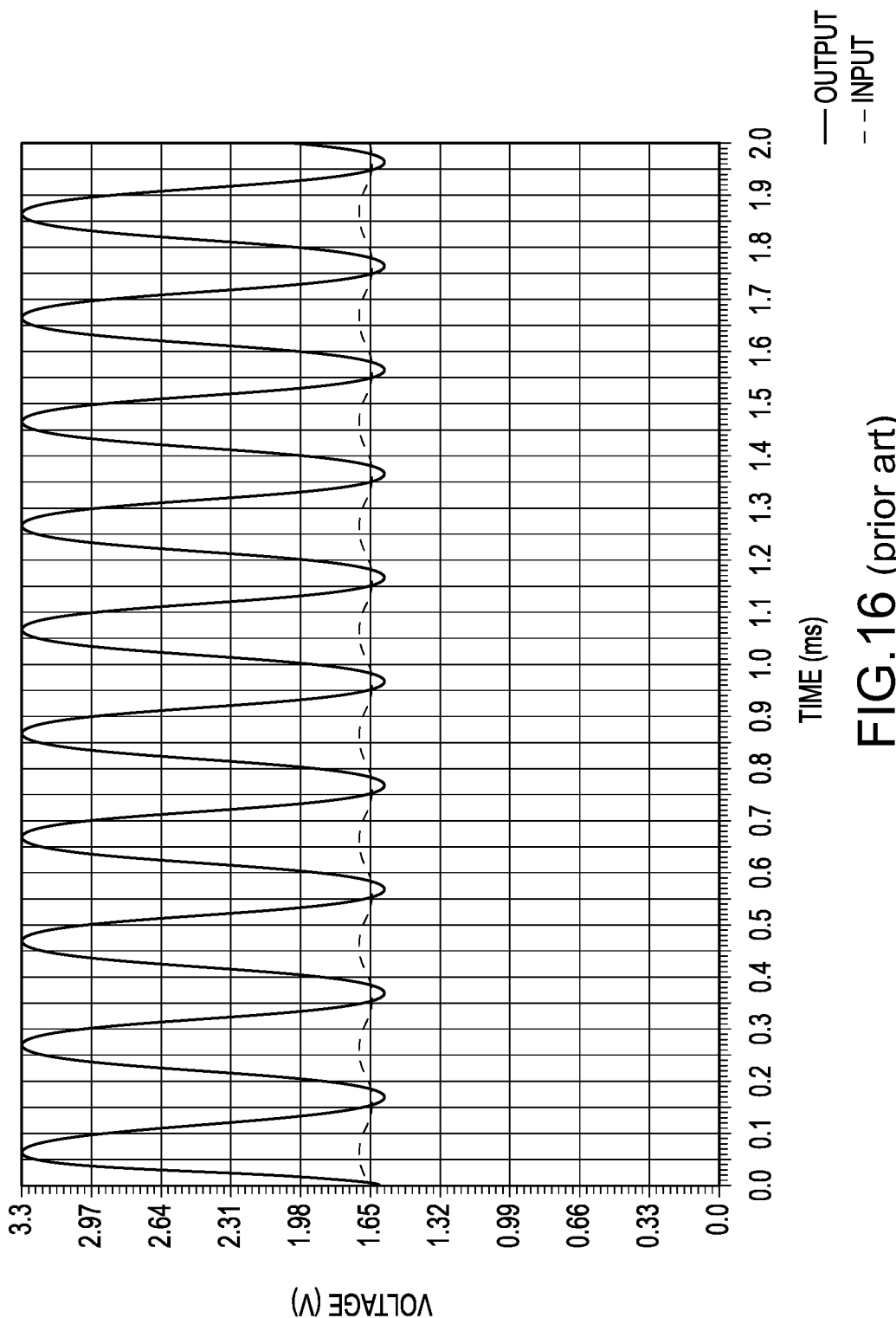
FIG. 16 is a graph illustrating an input signal and a corresponding output signal of a conventional amplifier circuit.
Figure 17:
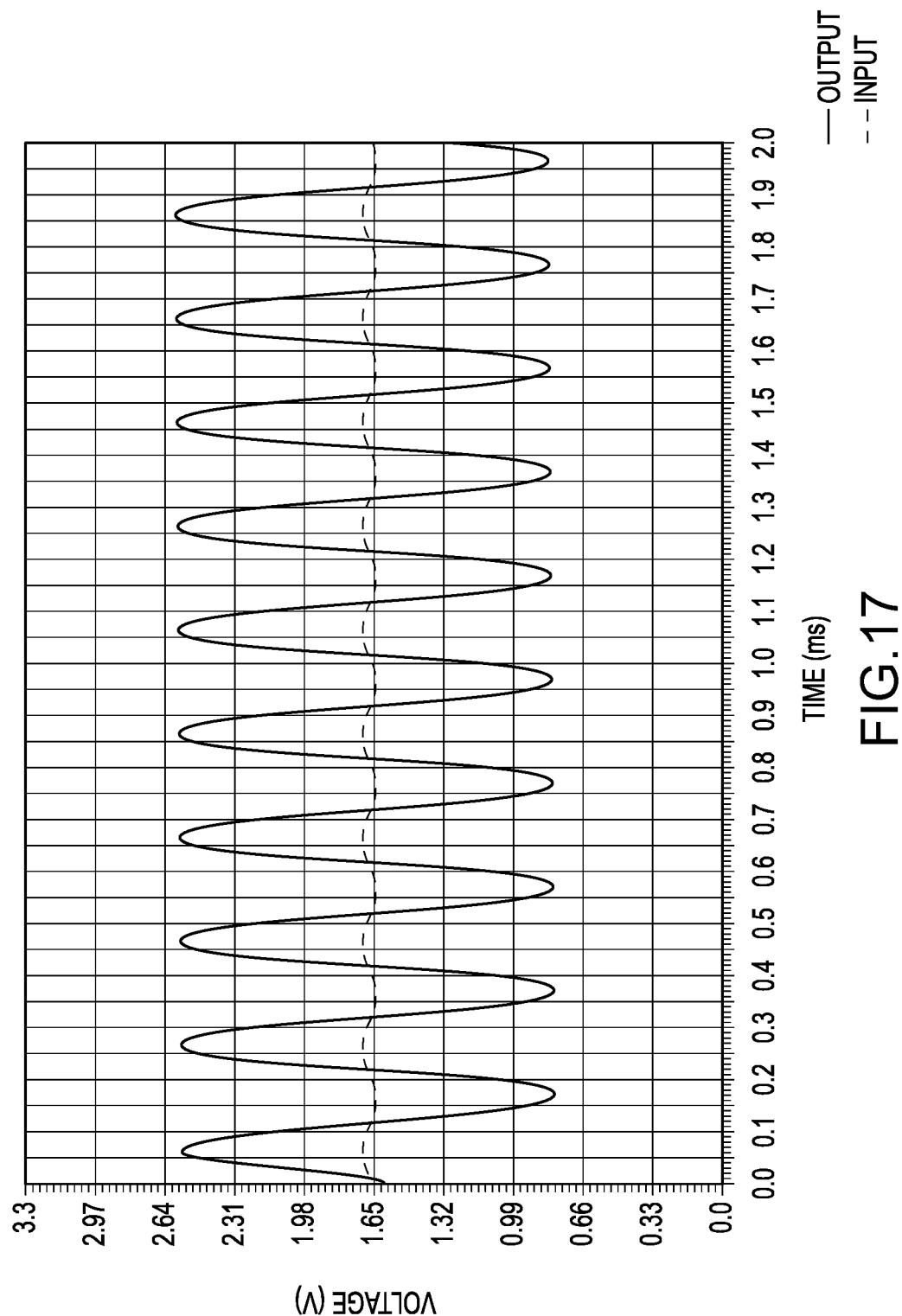
FIG. 17 is a graph illustrating an input signal and a corresponding output signal according to various embodiments of the present technology.

In operation, and according to various embodiments, the op-amp 302 may exhibit an output signal $V_{OUT}$ with little to no offset and low noise characteristics. For example, and referring to FIG. 17, given a particular input signal, the output signal is an amplified version of the input signal and does not exhibit an offset. In contrast, and referring to FIG. 16, given a particular input signal, a conventional op-amp will generate an amplified output with an offset.

Figure 12:
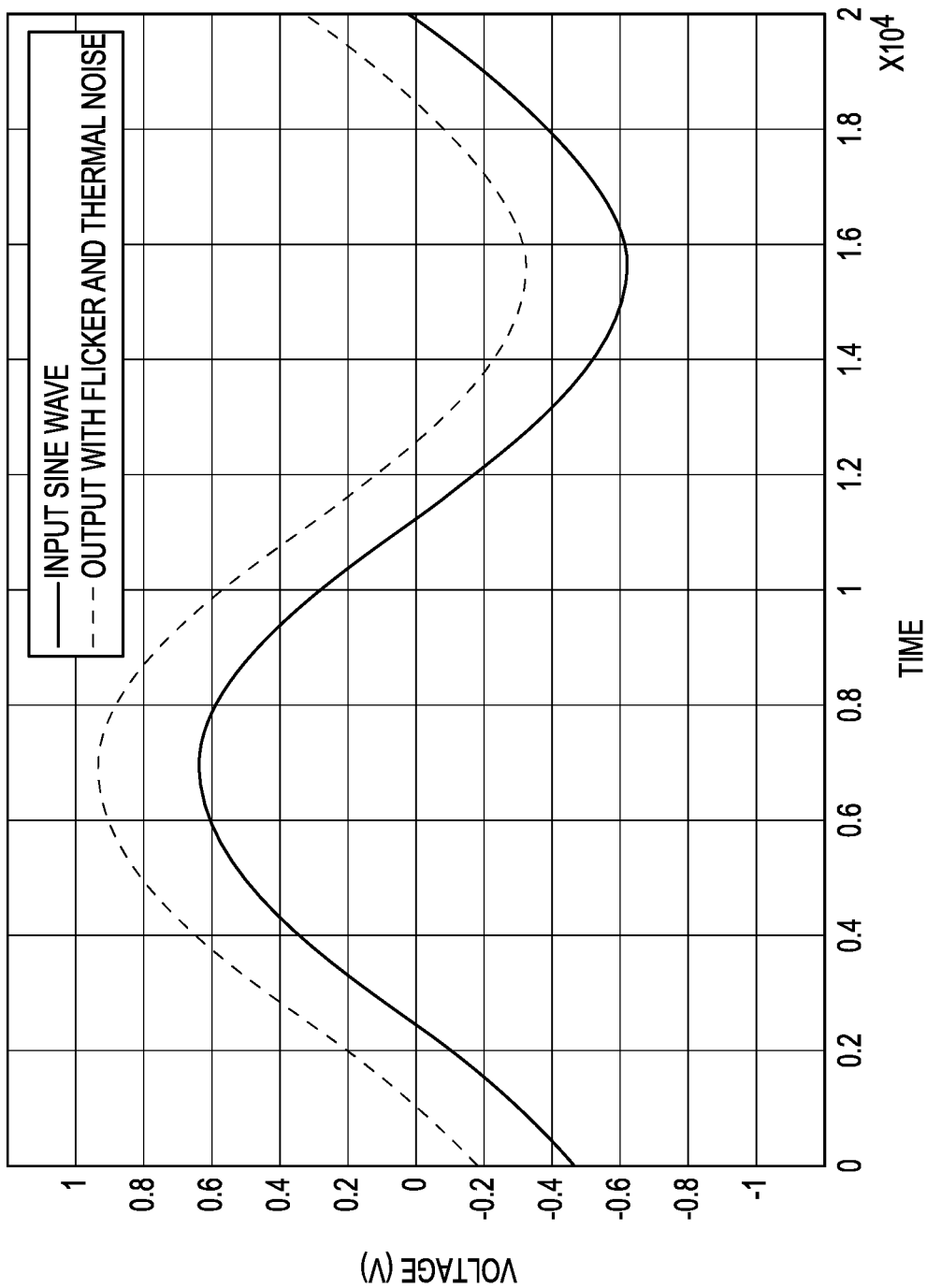
FIG. 12 is a graph illustrating an input signal and a corresponding output signal of a conventional amplifier circuit.
Figure 13:
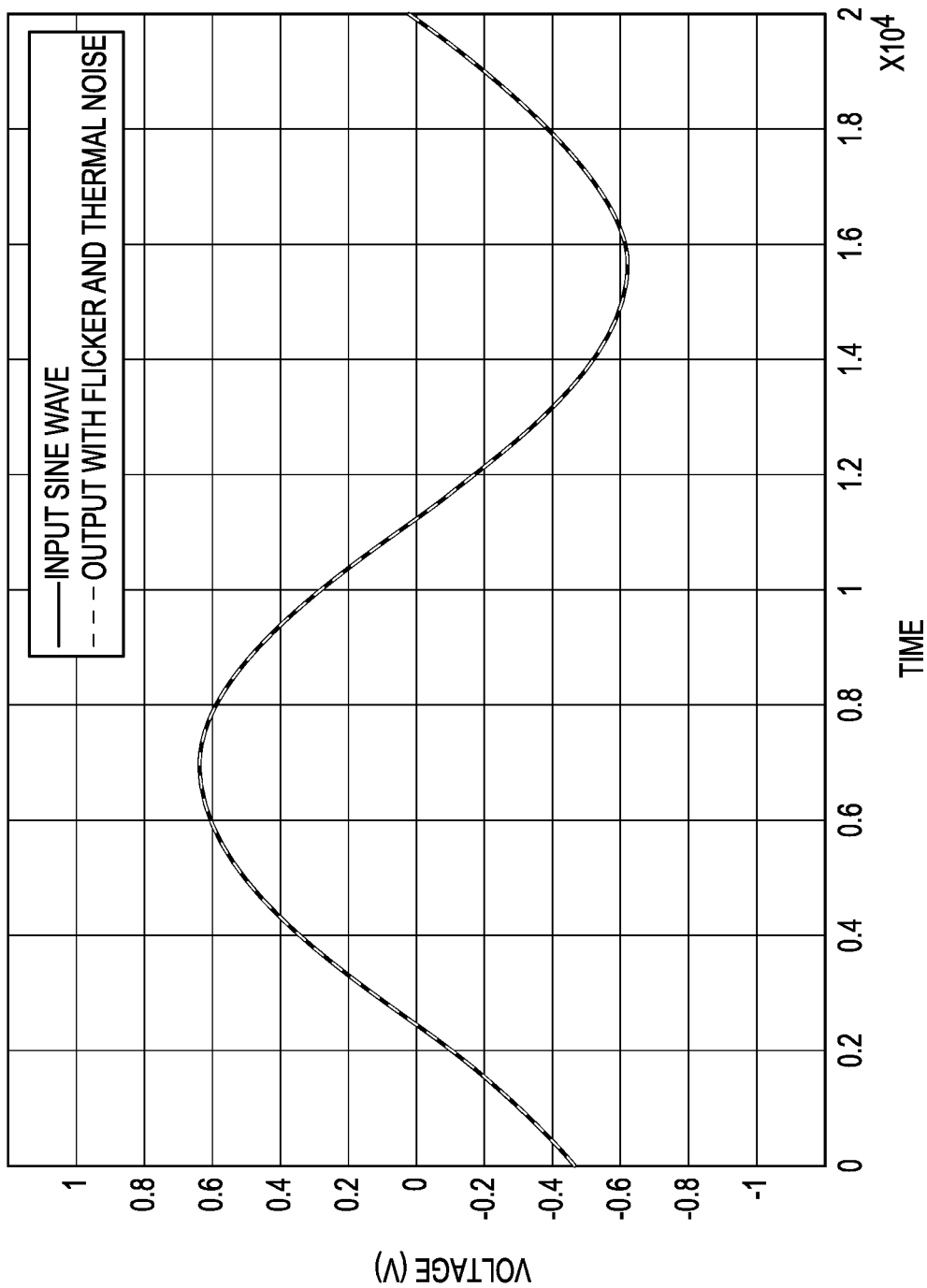
FIG. 13 is a graph illustrating an input signal and a corresponding output signal in accordance with various embodiments of the present technology.
Figure 14:
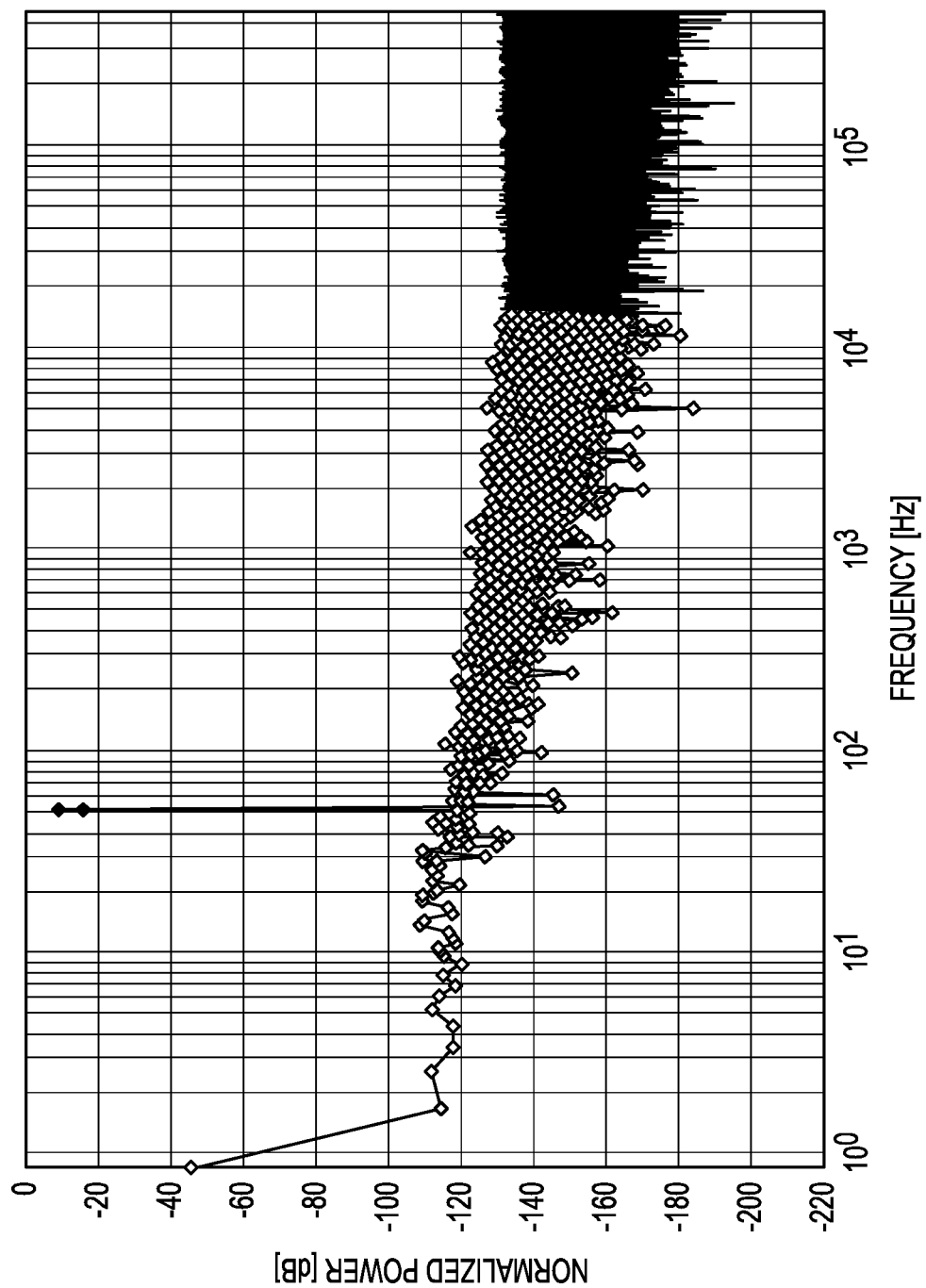
FIG. 14 is a frequency spectrum of a conventional amplifier circuit.
Figure 15:
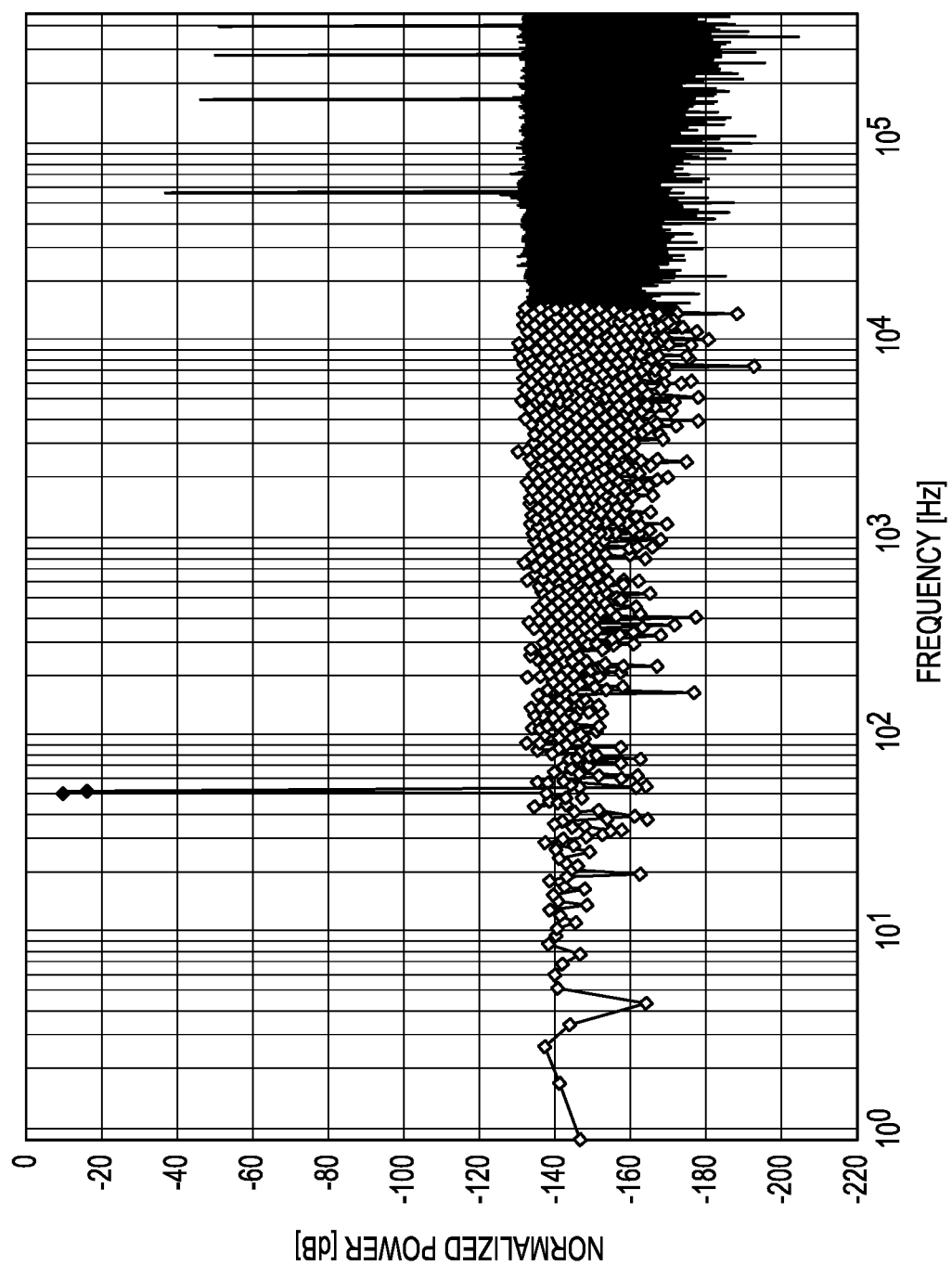
FIG. 15 is a frequency spectrum of an amplifier circuit in accordance with various embodiments of the present technology.

Referring to FIG. 13, and according to the present technology, given a particular input signal, the output signal of the op-amp 302 is not affected by flicker and thermal noise. In contrast, and referring to FIG. 12, given a particular input signal, the output signal of a conventional op-amp exhibits an offset when flicker and thermal noise are present. Referring to FIG. 15, and according to the present technology, the low noise and low offset characteristics may also be observed in a frequency spectrum plot. In contrast, and referring to FIG. 14, noise and offset may be observed in a frequency spectrum plot of a conventional op-amp.

Figure 8:
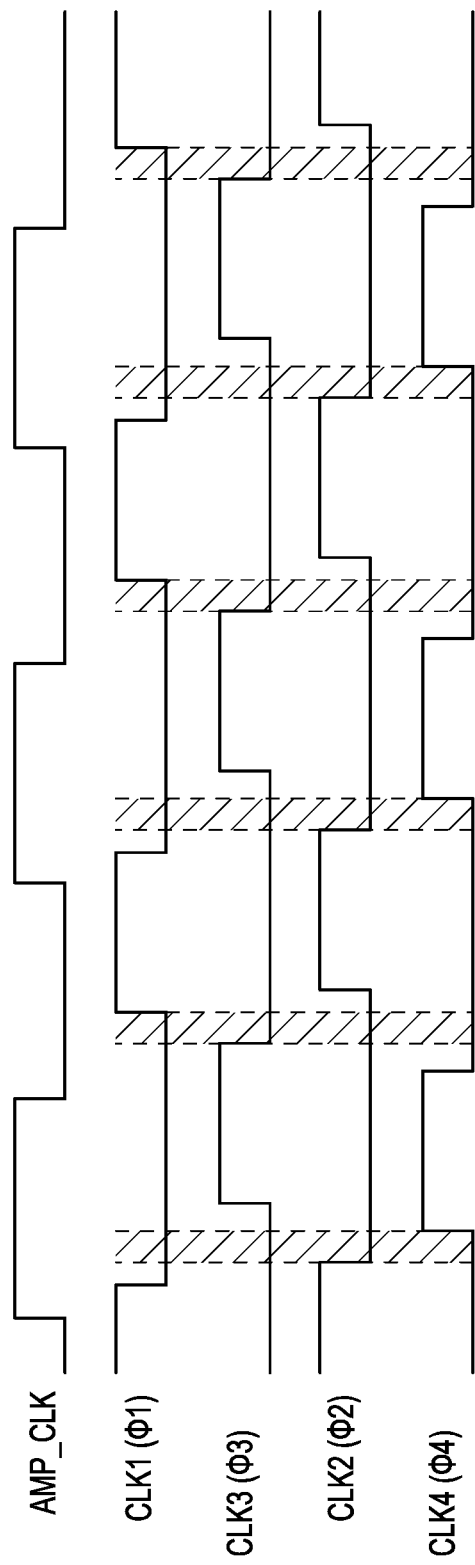
FIG. 8 is a timing diagram of an operational amplifier in accordance with the second embodiment the present technology.
Figure 9:
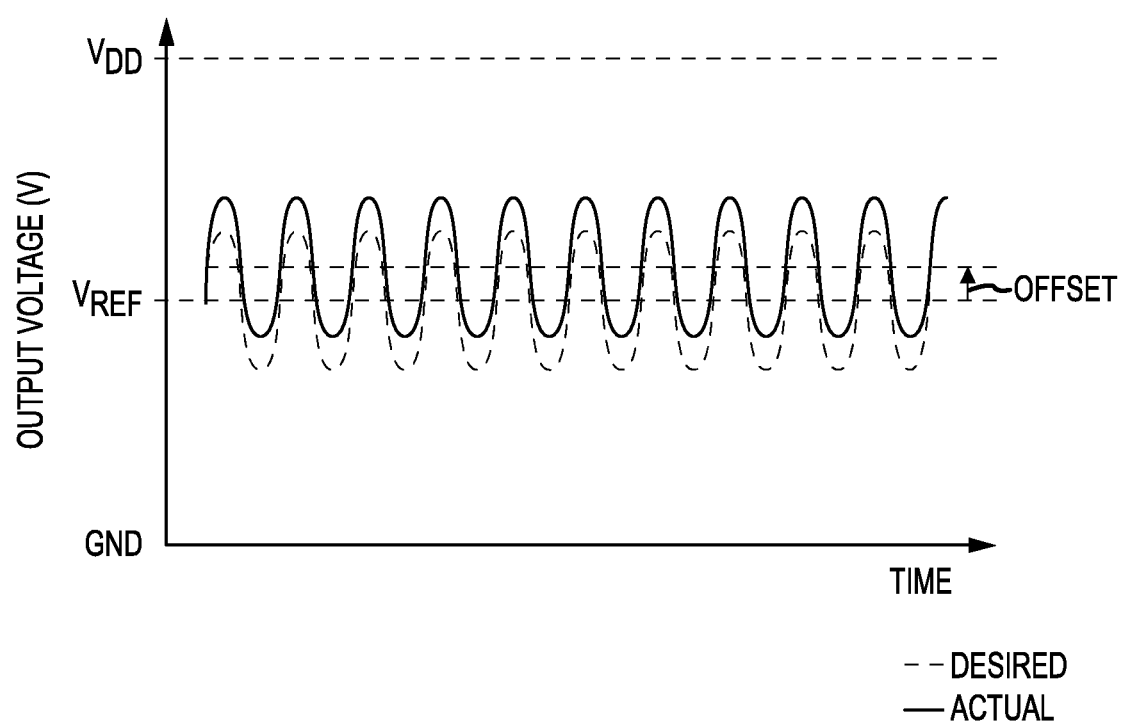
FIG. 9 is a graph illustrating an actual output voltage and a desired output voltage at a first gain.
Figure 10:
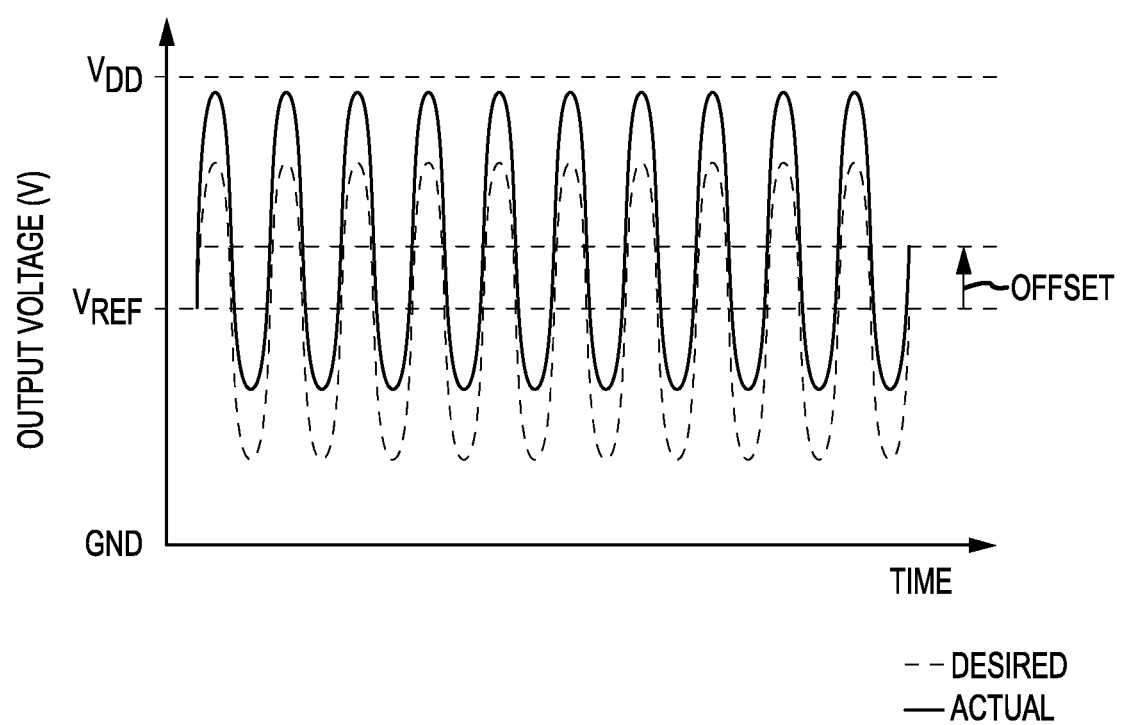
FIG. 10 is a graph illustrating an actual output voltage and a desired output voltage at a second gain.
Figure 11:
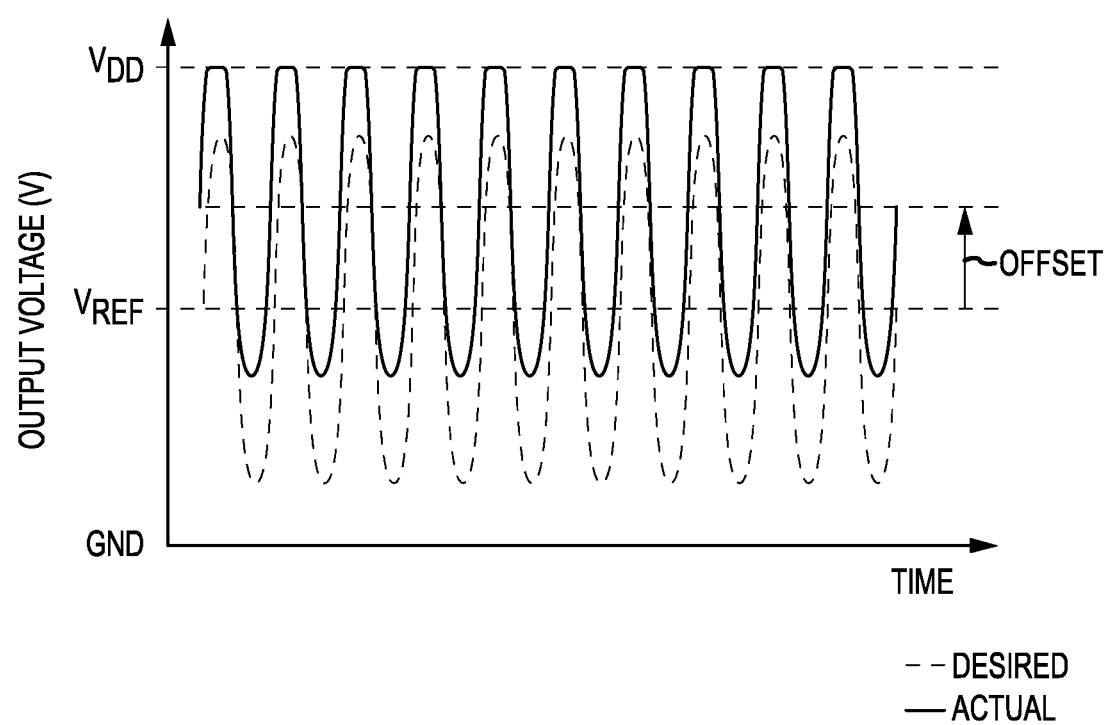
FIG. 11 is a graph illustrating an actual output voltage and a desired output voltage at a third gain.

According to an exemplary operation, and referring to FIGS. 7 and 8, the first cross-connect circuit 310 receives the first and second input signals $V_{IN\_N}$, $V_{IN\_P}$. The first, fourth, fifth, and eighth switches SW1, SW4, SW5, SW8 are closed, while the second, third, sixth and seventh switches SW2, SW3, SW6, SW7 are open. After some period of time, the first and fourth switches SW1, SW4 open. The fifth and eighth switches SW5, SW8 are also closed during a period of time commensurate with that of the first and fourth switches SW1, SW4 but open at some time after the first and fourth switches SW1, SW4 open. After the fifth and eighth switches SW5, SW8 open, the sixth and seventh switches SW6, SW7 close. After the sixth and seven switches SW6, SW7 close, the second and third switches SW2, SW3 close. During operation, a period of time exists where all switches SW1:SW8 are open (shown in shaded region).

According to an alternative embodiment, and referring to FIGS. 5 and 6, the first cross-connect circuit 310 receives the first and second input signals $V_{IN\_N}$, $V_{IN\_P}$. The first, fourth, fifth, and eighth switches SW1, SW4, SW5, SW8 are open, while the second, third, sixth and seventh switches SW2, SW3, SW6, SW7 are closed. After some period of time, the first and fourth switches SW1, SW4 close. The fifth and eighth switches SW5, SW8 are also open during a period of time commensurate with that of the first and fourth switches SW1, SW4 but close at some time after the first and fourth switches SW1, SW4 close. After the fifth and eighth switches SW5, SW8 close, the sixth and seventh switches SW6, SW7 open. After the sixth and seven switches SW6, SW7 open, the second and third switches SW2, SW3 open. During operation, a period of time exists where all switches SW1:SW8 are open (shown in shaded region).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An operational amplifier, comprising:
 a first cross-connect circuit responsive to a first clock signal having a first phase and a third clock signal having a third phase and configured to receive a first input signal and a second input signal;
 an input stage circuit connected to the first cross-connect circuit and configured to apply a first gain to the first and second input signals;
 a second cross-connect circuit connected to the input stage circuit and responsive to a second clock signal having a second phase and a fourth clock signal having a fourth phase;
 a voltage adjustment circuit connected to the input stage circuit and configured to provide a stable voltage to the input stage circuit; and
 an output stage circuit connected to the second cross-connect circuit and configured to apply a second gain to the first and second input signals and generate an output voltage;
 wherein the first, second, third, and fourth clock signals are distinct from each other.

2. The operational amplifier according to claim 1, wherein:
the first, second, third, and fourth phases are offset from each other; and
the first, second, third, and fourth clock signals have a same frequency.

3. The operational amplifier according to claim 2, wherein the offset provides a period of time when the first, second, third, and fourth clock signals have a same signal level.

4. The operational amplifier according to claim 1, wherein the first cross-connect circuit comprises:
a first switch responsive to the first clock signal;
a second switch in parallel with the first switch and responsive to the third clock signal;
a third switch in series with the first switch and responsive to the third clock signal; and
a fourth switch in series with the second switch and responsive to the first clock signal.

5. The operational amplifier according to claim 4, wherein:
the input stage circuit comprises a differential transistor pair comprising NMOS transistors; and
the first, second, third, fourth switches comprise PMOS transistors.

6. The operational amplifier according to claim 4, wherein:
the first cross-connect circuit comprises a third node located between the first and third switches and a fourth node located between the second and fourth switches; and
the input stage circuit comprises a differential transistor pair comprising a first transistor and a second transistor, wherein the first transistor is connected to the third node and the second transistor is connected to the fourth node.

7. The operational amplifier according to claim 4, where the second cross-connect circuit comprises:
a fifth switch responsive to the second clock signal;
a sixth switch in parallel with the fifth switch and responsive to the fourth clock signal;
a seventh switch in series with the fifth switch and responsive to the fourth clock signal; and
an eighth switch in series with the sixth switch and responsive to the second clock signal.

8. The operational amplifier according to claim 7, wherein:
the input stage circuit comprises a differential transistor pair comprising PMOS transistors; and
the first, second, third, fourth switches comprise NMOS transistors.

9. A method for removing an offset voltage from an output signal of an operational amplifier, comprising:
generating:
a first clock signal having a first phase;
a second clock signal having a second phase;
a third clock signal having a third phase; and
a fourth clock signal having a fourth phase, according to a reference clock signal;
selectively transmitting a first input signal and a second input signal to an input stage circuit with a first cross-connect circuit, wherein the first cross-connect circuit comprises:
a first switch responsive to the first clock signal;
a second switch in parallel with the first switch and responsive to the third clock signal;
a third switch in series with the first switch and responsive to the third clock signal; and
a fourth switch in series with the second switch and responsive to the first clock signal;
selectively transmitting the first input signal and the second input signal from the input stage circuit to an output stage circuit with a second cross-connect circuit, wherein the second cross-connect circuit comprises:
a fifth switch responsive to the second clock signal;
a sixth switch in parallel with the fifth switch and responsive to the fourth clock signal;
a seventh switch in series with the fifth switch and responsive to the fourth clock signal; and
an eighth switch in series with the sixth switch and responsive to the second clock signal; and
regulating a voltage of the input stage circuit with a voltage adjustment circuit.

10. The method according to claim 9, further comprising applying a first bias voltage and a second bias voltage to the input stage circuit.

11. The method according to claim 9, wherein regulating the voltage of the input stage circuit comprises applying a third bias voltage to the voltage adjustment circuit.

12. The method according to claim 9, wherein:
each of the first, second, third, and fourth phases are offset from each other; and
the first, second, third, and fourth clock signals have a same frequency.

13. The method according to claim 12, wherein the offset provides a period of time when the first, second, third, and fourth clock signals have a same signal level.

14. A system, comprising:
a clock generator configured to generate: a first clock signal having a first phase, a second clock signal having a second phase, a third clock signal having a third phase, and a fourth clock signal having a fourth phase, according to a reference clock signal; wherein the first, second, third, and fourth clock signals are distinct from each other;
an operational amplifier in communication with the clock generator and comprising:
a first cross-connect circuit responsive to the first clock signal and the third clock signal and configured to receive a first input signal and a second input signal;
an input stage circuit connected to the first cross-connect circuit and configured to apply a first gain to the first and second input signals;
a second cross-connect circuit connected to the input stage circuit and responsive to the second clock signal and the fourth clock signal;
an output stage circuit connected to the second cross-connect circuit and configured to apply a second gain to the first and second input signals and generate an output voltage; and
an analog-to-digital converter (ADC) configured to:
operate according to an ADC clock; and
convert the output voltage to a digital signal.

15. The system according to claim 14, wherein the reference clock signal is proportional to the ADC clock by a factor of 1/N, where N is a natural number.

16. The system according to claim 14, wherein the operational amplifier further comprises a voltage adjustment circuit connected to the input stage circuit and configured to provide a stable voltage to the input stage circuit.

17. The system according to claim 14, wherein:
each of the first, second, third, and fourth phases are offset from each other; and
the first, second, third, and fourth clock signals have a same frequency.

18. The system according to claim 14, wherein:
the first cross-connect circuit comprises:
   a first switch responsive to the first clock signal;
   a second switch in parallel with the first switch and responsive to the third clock signal;
   a third switch in series with the first switch and responsive to the third clock signal; and
   a fourth switch in series with the second switch and responsive to the first clock signal; and
the second cross-connect circuit comprises:
   a fifth switch responsive to the second clock signal;
   a sixth switch in parallel with the fifth switch and responsive to the fourth clock signal;
   a seventh switch in series with the fifth switch and responsive to the fourth clock signal; and
   an eighth switch in series with the sixth switch and responsive to the second clock signal.

19. The system according to claim 18, wherein:
the first cross-connect circuit further comprises a third node located between the first and third switches and a fourth node located between the second and fourth switches; and
the input stage circuit comprises a differential transistor pair comprising:
   a first transistor comprising a gate terminal connected to the third node; and
   a second transistor comprising a gate terminal connected to the fourth node.

20. The system according to claim 14, wherein:
the input stage circuit is configured to operate according to a first bias voltage and a second bias voltage; and
the voltage adjustment circuit is configured to operate according to a third bias voltage.

* * * * *